United States Patent [19]

Thompson

[11] Patent Number: 4,506,232
[45] Date of Patent: Mar. 19, 1985

[54] THIRD ORDER PLL WITH INCREASED HIGH FREQUENCY GAIN

[75] Inventor: William J. Thompson, Richardson, Tex.

[73] Assignee: Rockwell International Corporation, El Segundo, Calif.

[21] Appl. No.: 399,536

[22] Filed: Jul. 19, 1982

[51] Int. Cl.³ .......................... H03L 7/08; H03L 7/10
[52] U.S. Cl. ........................................ 331/16; 331/17; 331/25; 455/260
[58] Field of Search ............................ 331/16, 17, 25; 455/260; 375/120

[56] References Cited

U.S. PATENT DOCUMENTS

| | | | |
|---|---|---|---|
| 3,740,671 | 6/1973 | Crow et al. ...................... | 331/17 X |
| 4,059,805 | 11/1977 | de Laage de Meux et al. ... | 375/120 X |
| 4,208,635 | 6/1980 | Fazakerly et al. ................ | 331/17 |
| 4,380,743 | 4/1983 | Underhill et al. ................ | 331/16 X |

OTHER PUBLICATIONS

Motal, G. W., "Continuous Control of Phase Locked Loop Bandwidth", *NASA Tech. Briefs*, Spring 1980, vol. 5, No. 1, p. 10.

*Primary Examiner*—Eugene R. LaRoche
*Assistant Examiner*—D. C. Mis
*Attorney, Agent, or Firm*—Richard A. Bachand; V. Lawrence Sewell; H. Fredrick Hamann

[57] ABSTRACT

A third order phase-locked loop providing increased gain in the high frequency portion of a predefined bandwidth includes an oscillator providing a reference signal, a voltage controlled oscillator (VCO) providing a variable signal, and a phase detector for comparing the phase of the reference signal to the phase of the variable signal. The phase detector produces a difference signal for application to an input of the VCO to bring the variable signal into phase with the reference signal. First and second active amplifiers are connected in series between the output of the phase detector and the input to the VCO, operative to provide decreasing loop gain with increasing frequency at the rate of 18 db per octave at frequencies approaching the predefined bandwidth.

2 Claims, 2 Drawing Figures

THIRD ORDER PLL WITH INCREASED HIGH FREQUENCY GAIN

BACKGROUND OF THE INVENTION

1. Field of the Invention

This invention relates to improvements in phase-locked loops, and more particularly to improvements in phase-locked loop circuitry to achieve high gain within the bandwidth of the loop while employing amplifiers of moderate gain bandwidth capabilities.

2. Description of the Prior Art

Commonly, instead of employing a single free running oscillator to generate signal frequencies required by some microwave radio systems, two oscillators—a voltage controlled oscillator (VCO) and a reference oscillator are employed together with a phase-locked loop circuit that causes the frequency of the VCO to be controlled by the frequency of the reference oscillator. The output signal is supplied by the usually higher powered VCO which, although of usually poorer frequency stability, because of the phase-locked loop, now has the good frequency stability of the reference oscillator. Proper design of the phase-locked loop circuitry can result in a phase-locked VCO whose long and short term output frequency stability is better than either the free runing VCO or reference oscillator alone. The optimum phase-locked frequency phase stability may call for phase-locked loop circuit gain that is difficult to realize using the prior art circuits.

Digital microwave radio systems employing phase modulation have been encumbered with problems involving intermittent errors, such as in rf sources which experience short duration phase errors which exceed the error threshold of the system. (The term "short duration" is used to denote an event, on the order of less than a millisecond, and perhaps as low as a few nanoseconds.) The problem is often aggravated, since the errors occur only intermittently, and since they occur so fast, the error producing faults are extremely difficult to identify and locate to correct, if such identification and location is possible at all.

Microwave systems typically employ a phase-locked loop in which the phase of a reference oscillator and the phase of a voltage controlled oscillator (VCO) are compared by a phase detector, mixer, or the like. The output of the phase detector is usually amplified and filtered before being supplied to a frequency control input of the VCO. The VCO then outputs a frequency which can be used for signal transmission in the transmitter or as a comparison reference in the receiver. The circuit which includes the phase-locked loop is referred to herein as a frequency source, or sometimes just as a source, with respect to either transmitters or receivers, since both are affected by the same constraints and considerations.

In such microwave systems the rapidly occurring phase errors have been found to result mostly from shifts in frequency by the VCO, and may be caused, for instance, by intermittent electrical contacts in the VCO, or by changes in a VCO load, such as a frequency multiplier, or by mechanical bump on the circuit, or by one of a manifold number of other causes.

When the frequency of the VCO does shift, the phase difference between the VCO and the signal of the reference oscillator starts to change as a result of the shift. The phase error or difference signal output by the phase detector is generally amplified by an amplifier and, in some instances, shaped, and then applied to a VCO input to change the VCO frequency output to compensate for the undesired frequency shift. The compensating signal, however, does not act instantaneously or completely, because such phase error correction would require infinite gain and frequency response in the loop. Thus, to achieve such fast response, the bandwidth of the loop (i.e. the frequency at which the loop gain is one) is made as large as possible. It can therefore be seen that the faster the feedback compensation can be provided, the sooner the phase error can be corrected. At the same time, a maximum amount of loop gain is desired at frequencies below the loop bandwidth because it dereases the percentage of the time that the VCO frequency remains uncorrected, and thereby more nearly meets the requirements of the transmitter or receiver.

The significance of the loop bandwidth to the phase-locked source is that the FM noise of the source output tends to follow the FM noise of the reference oscillator, up to the loop bandwidth frequency. Above the loop bandwidth frequency, the FM noise of the source output tends to follow that of the unphase-locked VCO. Since the low frequency FM noise of the reference oscillator is better than that of the VCO and the high frequency FM noise of the VCO is better than that of the reference oscillator, appropriate choice of the loop bandwidth can produce a phase-locked source with lower FM noise than either the reference oscillator or the VCO alone.

The simplest phase-locked loop (first order) employs an error amplifier with a flat frequency response. The fact that the output of the phase detector (output voltage proportional to phase difference) is applied to the VCO (output frequency proportional to voltage input) gives a loop gain frequency response that decreases 6 db for every octave of increased frequency (with infinite gain at zero frequency).

The most commonly employed second order phase-locked loop employs an amplifier filter with a 6 db gain decrease per octave of increasing frequency over all or most of the loop bandwidth. This amplifier/filter gain functions combined with the 6 db per octave gain slope of the phase detector and VCO combination gives an overall loop gain slope of 12 db over all or most of the loop bandwidth. The 6 db amplifier filter gain slope is most commonly obtained by a flat amplifier followed by a passive RC filter, but in some cases an active filter/amplifier is employed.

Conventional phase-locked loop circuits are typically kept to a second-order loop gain function or less because second-order loop gain is well understood in the art and can be achieved with relatively simple circuitry. (A first-order loop gain function is 6 db per octave; a second-order loop gain function is 12 db per octave.) In a second-order loop, as frequency decreases to values within the loop bandwidth, the gain rises at the rate of 12 db per octave to a given corner frequency and then continues to rise at 6 db per octave as the frequency further decreases.

Third order (18 db per octave) loop gain functions are acknowledged as feasible in the art, but are usually avoided because of their uncertainty and perceived complexity, due to the lack of practical teachings and circuit implementations.

Although third order phase-locked loops are relatively uncommon, it is true that the prior art sources did employ third order phase-locked loops. The amplifier/filter in these sources typically contained an amplifier/active filter followed by a passive filter to realize a 12 db per octave loop gain slope, which resulted in an overall 18 db per octave gain slope.

Frequency or phase modulation noise considerations usually determine the optimum phase-locked loop bandwidth at which frequency the loop gain is unity (0 db). The loop gain rises as the modulation frequencies fall below the loop bandwidth frequency. Higher order loops, because of the higher slopes of their gain versus frequency curves, will have higher gain within the loop bandwidth, and as a result more complete error reduction.

A brute force approach to increasing both the bandwidth and loop gain has been attempted by merely modifying the time constants and the gain levels in the loop. Unfortunately, this simple scaling process calls for a very high amplifier gain-bandwidth product; so high, in fact, that such amplifiers are difficult to fabricate and are extremely costly. In addition, the mere uncontrolled gain increase results in loop saturation or instability, and, hence, may render the device with which the loop is associated essentially inoperable. Another approach to the problem is to simply reduce the loop gain to reduce the amplifier gain-bandwidth product requirement, but this is done at the tradeoff of lower loop gains at low frequencies.

When it was desired to increase the loop bandwidth of the sources it was not possible to do so with the prior art circuit topology because of gain-bandwidth limitations of the available operational amplifiers. It was possible to obtain the wider loop bandwidth with a second order phase-locked loop, but this sacrificed the higher loop gain advantages of the third order loop.

SUMMARY OF THE INVENTION

In light of the above, it is an object of the invention to substantially increase the phase-locked loop bandwidth for fast respons with maximized loop gain within that bandwidth thereby affording increased loop gain at the high end frequencies within the bandwidth and with reduced gain-bandwidth requirements on the amplifier(s) of the loop.

It is another object of the invention to provide a phase-locked loop of the type described which employs a third-order gain function.

These and other objects, features and advantages will become apparent to those skilled in the art from the following detailed description, when read in conjunction with the accompanying drawings and appended claims.

The present invention provides a third-order loop wherein the gain rises at the rate of 18 db per octave inside the loop bandwidth. This slope, which is steeper than first or second-order loops enables the gain to rise to a given gain level sooner than the more gradual 12 db per octave slope of second-order loops. This, in turn, affords increased gain at the higher end frequencies within the loop bandwidth and achieves a quicker response and more complete error correction.

The present invention provides a third-order loop gain function for an active amplifier phase-locked loop at high loop bandwidths with relatively simple circuitry. Furthermore, the loop gain and frequency shaping are provided by active amplification, unlike the capacitive or passive filters which otherwise limit the gain by effectively wasting the amplifier gain.

BRIEF DESCRIPTION OF THE DRAWING

The invention is illustrated in the accompanying drawing, in which.

DETAILED DESCRIPTION OF A PREFERRED EMBODIMENT

Figure 1:
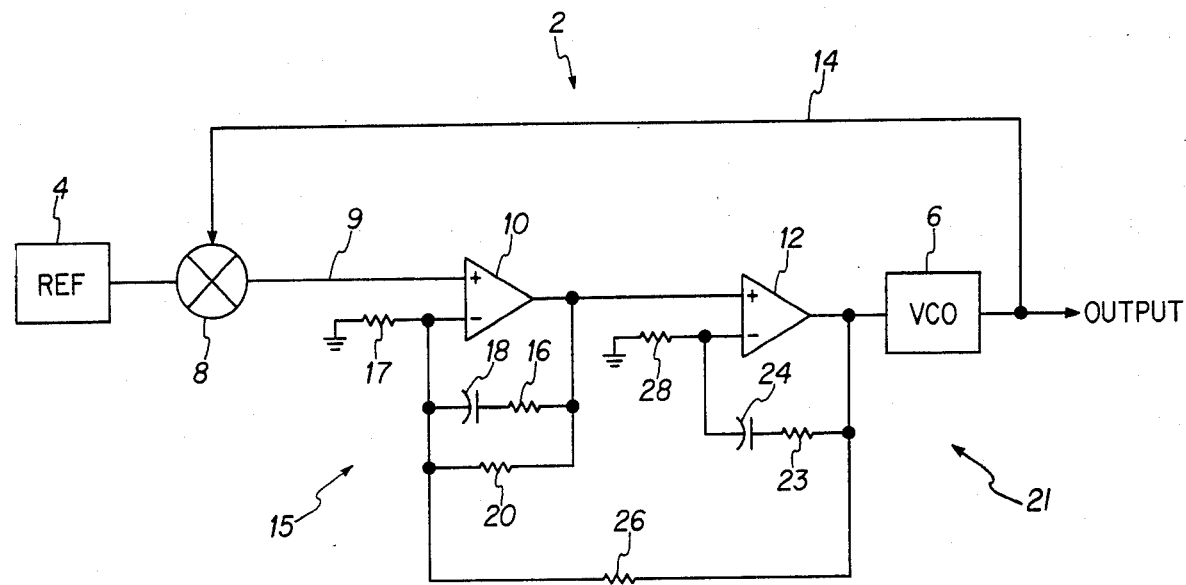
FIG. 1 is a schematic diagram of a phase-locked loop, in accordance with the invention.

A preferred embodiment of the invention is shown in FIG. 1, in which a third-order phase-locked loop 2 provides increased gain at higher frequencies than that achieved heretofore with one or two order loops. The loop 2 includes a reference crystal oscillator 4 and a voltage controlled oscillator (VCO) 6. A phase detector 8, such as a mixer or the like, compares the phase of the reference oscillator 4 with the output of the VCO 6, and generates an output phase error, or difference signal, on the line 9 to first and second active amplifiers 10 and 12. Amplifiers 10 and 12 are connected in series between the output of the phase detector 8 and the frequency control input to the VCO 6, and serves to amplify and frequency shape the phase error signal on the line 9 for delivery to the VCO 6, for compensatingly changing the frequency output of the VCO 6. The output of the VCO 6 is fed back via a return line 14 to the phase detector 8.

The amplifiers 10 and 12 have frequency shaping feedback means 15 and 21 providing decreasing loop gain with increasing frequency at the rate of 18 db per octave at frequencies approaching the loop bandwidth. The amplifier 10 can be, for instance, an operational amplifier, as shown, having a non-inverting input at its plus terminal connected to the output of the phase detector 8. The output of the amplifier 10 is connected in a feedback circuit including a resistor 16 and a capacitor 18 to an inverting input of the amplifier 10, at its minus terminal. A resistor 20 is also connected in the feedback circuit in parallel with the resistor 16 and the capacitor 18. In operation, at low frequencies, the capacitor 18 is nonconducting, and the output of the amplifier 10 is fed back through the resistor 20 to the inverting input of the amplifier 10. The resistor is of a relatively high value, affording a small level of negative feedback to the input of the amplifier 10 to produce a high level of amplification by the amplifier 10. At low frequencies, the resistors 20 and 17 form a feedback divider causing the effective gain of the amplifier to be constant down to dc. As the frequency increases, the capacitor 18 becomes more conductive to feed back a correspondingly larger signal from the output of the amplifier 10 through the smaller valued resistor 16 to the negative or inverting terminal of the amplifier 10. This increased signal, therefore increases the negative feedback, resulting in a lower amplifier gain level. A resistor 17 is connected from the inverting input of the amplifier 10 to ground to limit the feedback by forming the lower part of the feedback divider. At higher frequencies, the resistors 16 and 17 form a feedback divider causing the effective gain of the amplifier 10 to be constant up to a frequency limited by the capabilities of the amplifier.

A second amplifier 12, which also can be an operational amplifier, as shown, has a first input, such as its non-inverting, or plus, terminal, connected to the output of the amplifier 10. The second amplifier 12 has an output which is connected to the input of the VCO 6, and which is also connected in a feedback circuit 21 including a resistor 23, a capacitor 24, and a resistor 28 acting as a feedback divider, to an inverting, or negative, input to the amplifier 12. Another feedback resistor 26 is connected between the output of the second amplifier 12 and the inverting input, or minus terminal, of the amplifier 10 and is operative in combination with the capacitors 18 and 24 to provide frequency shaping. It should be noted that the amplifier 12 has no feedback at DC, so its effective gain climbs to very high values at low frequencies, limited only by the intrinsic gain of the amplifier 12, which, commonly, may be very high (i.e., GT 50,000).

In operation, at low frequencies, the capacitor 24 is nonconductive, and little, if any, negative feedback is supplied to the minus terminal of the amplifier 12. This enables the amplifier 12 to produce a high gain level at its output. At the same time, the feedback resistor 26 provides feedback from the output of the amplifier 12 at low frequencies to the inverting input of the amplifier 10, to thus control, in combination with resistor 17, the overall gain of the amplifiers 10 and 12 at lower frequencies. The resistor 26 may alternatively be connected at its left end back to the input of the amplifier 12 (connection not shown) and balanced against resistor 20 in a desired ratio. As the frequency increases, the capacitor 24 becomes more conductive and enables a larger amount of feedback through smaller valued resistor 23 to the minus terminal of the amplifier 12 to thus reduce its gain. As the frequency decreases, the cascaded gain of the amplifiers 10 and 12 continue to increase. At a sufficiently low frequency, the gain becomes high enough that the overall feedback divider resistors 26 and 17 limit the overall amplifier gain by providing negative feedback from the output of amplifier 12 to the negative input of amplifier 10.

The intrinsic loop gain function caused by the phase detection frequency control operation is 6 db per octave at all frequencies. Each amplification stage 10 and 12 adds another 6 db per octave to the intrinsic slope, resulting in a cumulative loop gain frequency roll-off slope of 18 db per octave. It can be seen that with increasing frequency, the loop gain falls along the slope 30 at the rate of 6 db per octave to the corner frequency 32. It then falls at the rate of 18 db per octave to the corner frequency 38, as illustrated by the solid line 34, then flattens out again to a decreasing 6 db per octave 36 above the second corner frequency 38 approaching the loop bandwidth.

The component values of the frequency shaping networks 15 and 21, in combination with resistor 26, are chosen so that they have the same corner frequencies 32 and 38. If this were not done, there would be 12 db per octave slopes at the ends of the 18 db per octave slope. In any case, the transitions 32 and 38 between the 6 db and 18 db per octave slopes is not as quite abrupt as is shown in the figure, which is shown in the sharp fashion primarily for clarity of illustration of the principles of the invention.

In contrast to the frequency response of the invention, a 12 db per octave slope, shown by the dotted line 41 rises at a slower rate and does not reach the corner frequency 44 as quickly as the 18 db per octave slope. It is thus seen that in the high frequency range 40 within the loop bandwidth, a higher amount of gain is provided by the third-order 18 db per octave loop gain function of the invention than is provided by the 12 db per octave slope generated by such second-order circuits used heretofore.

It will be appreciated that the circuitry of the phase-locked loop 2 is simple and inexpensive. Neither the amplifier 10 or 12 is required to have an extremely high gain-bandwidth product. Also, the phase-locked loop 2 reacts quickly and within a high gain level to afford enchanced phase error correction.

Figure 2:
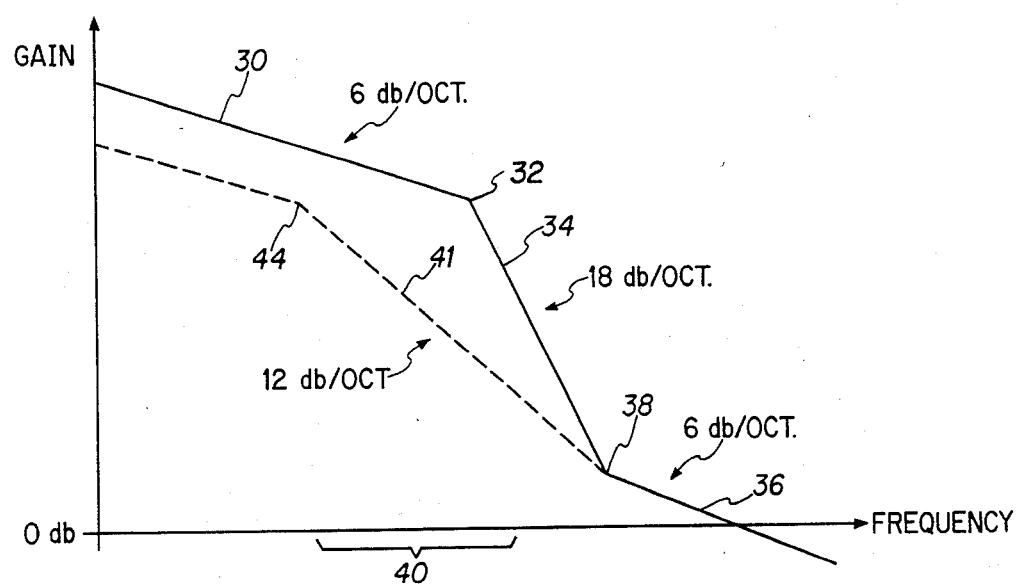
FIG. 2 is a graph of frequency vs. gain, showing the third-order loop gain function of the present invention (solid line) contrasted against a second-order loop gain function (dashed line).

When the frequency of the VCO 6 abruptly changes, for example, due to mechanical shocks or instability in the radio, the frequency shift at the output of the VCO 6 can be nearly instantaneous. However, the phase shift output by phase detector 8 is not instantaneous. The phase error shift is analogous to a ramp, and increases linearly. The quicker that high gain feedback compensation can be provided, the sooner the phase error shift can be changed from an increasing ramp to a decreasing ramp and back to no error at all. As seen in FIG. 2, as the frequency decreases to values inside the bandwidth, phase-locked loop 2 provides extremely quick and more complete response, with gain rising at the rate of 18 db per octave. A higher amount of gain is provided at upper end frequencies within the bandwidth which would otherwise be in the transition section of a 12 db per octave slope. Thus the phase-locked loop 2 provides faster and more complete correction of phase errors.

The third-order loop gain and frequency shaping function of the phase-locked loop 2 is provided with active amplification, thus yielding a higher gain level plateau 30 than would otherwise be available if passive frequency shaping, for example, capacitive filters, were used, since passive frequency shaping components do not contribute to the gain, and hence would reduce the gain plateau to a level which is lower than plateau 30. The present invention is not so limited by passive frequency shaping, but rather affords higher gain levels by avoiding the use of passive frequency shaping elements to provided an 18 db per octave third-order slope.

It should be noted that the effective gain of the two amplifiers 10 and 12 need not be equally partitioned. In fact, the gain can be partitioned to obtain substantial performance advantages, with amplifiers of different characteristics. For example, the amplifier 10 could posses a very high gain-bandwidth product, but have a poor output voltage capability. The amplifier 12, on the other hand, could posses a moderate gain-bandwidth product, but have a good output voltage capability. By proper choice of the feedback resistors 23 and 28, and 16 and 17 the amplifier 10 could deliver most of the high frequency gain, while the amplifier 12 could provide most of the low frequency gain and output level. In practice, large signal swings at high frequencies are seldom required, so this combination provides very good performance, while utilizing readily available amplifiers.

It should also be noted that the fact that two amplifiers are used reduces the gain-bandwidth requirements of the individual amplifiers, and the fact that the desired filter function is achieved with active amplification reduces the gain-bandwidth requirements of the amplifiers.

The typically available integrated circuit operational amplifiers have a tendency to have an intrinsic frequency response that falls at 6 db per octave over a large part of their bandwidth. Thus, the feedback networks 15 and 21 call for an amplifier gain shape similar to its natural capabilities and makes best use of the amplifier gain-bandwidth capabilities.

Although the invention has been described and illustrated with a certain degree of particularity, it is understood that the present disclosure has been made by way of example only and that numerous changes in the combination or arrangement of parts may be resorted to by those skilled in the art without departing from the spirit and scope of the invention as hereinafter claimed.

I claim:

1. A phase-locked loop comprising:

an oscillator providing a reference signal, a voltage controlled oscillator (VCO) providing a variable signal, means for comparing the phases of the reference and variable signals to produce a difference signal at an output thereof, and first and second amplifiers connected in series between the output of said phase comparing means and a frequency controlling input of said VCO, operative to provide decreasing loop gain with increasing frequency at the rate of about 18 db per octave within a bandwidth of the loop, said first amplifier having a first input connected to said output of said phase comparing means, and an output connected in a feedback circuit comprising a first capacitor to a second input to said first amplifier, said second amplifier having a first input connected to said output of said first amplifier, and an output connected to said input to said VCO and connected in a feedback circuit comprising a second capacitor to a second input to said second amplifier;

and further comprising feedback resistor means operative in combination with said amplifiers and said capacitors for providing said decreasing loop gain, said resistor means including a first resistor interconnecting said output of the second amplifier and said second input of the first amplifier.

2. The phase-locked loop of claim 1 wherein said feedback resistor means further comprises;

a second resistor connected between said output of said first amplifier and said second input of said first amplifier in parallel with said first capacitor;

and a third resistor connected between said output of said first amplifier and said second input of said first amplifier, in series with said first capacitor.

* * * * *